United States Patent
Hanselmann

(10) Patent No.: US 7,868,712 B2
(45) Date of Patent: Jan. 11, 2011

(54) CIRCUIT ARRANGEMENT FOR FREQUENCY MODULATION

(75) Inventor: Andreas Hanselmann, Schwabisch Hall (DE)

(73) Assignee: Atmel Automotive GmbH, Heilbronn (DE)

( * ) Notice: Subject to any disclaimer, the term of this patent is extended or adjusted under 35 U.S.C. 154(b) by 396 days.

(21) Appl. No.: 11/957,362

(22) Filed: Dec. 14, 2007

(65) Prior Publication Data

US 2008/0211595 A1 Sep. 4, 2008

Related U.S. Application Data

(60) Provisional application No. 60/875,810, filed on Dec. 20, 2006.

(30) Foreign Application Priority Data

Dec. 18, 2006 (DE) ................. 10 2006 061 511

(51) Int. Cl.
*H03C 3/00* (2006.01)
(52) U.S. Cl. ............... 332/117; 331/177 V; 331/16; 331/36 C; 331/175; 331/34; 332/124; 332/136
(58) Field of Classification Search .......... 331/175, 331/177 V, 36 C, 185; 332/117, 124, 136
See application file for complete search history.

(56) References Cited

U.S. PATENT DOCUMENTS

| 4,003,004 A | | 1/1977 | Fletcher et al. | |
|---|---|---|---|---|
| 4,003,034 A | * | 1/1977 | Au ............................. | 365/149 |
| 4,117,422 A | * | 9/1978 | Hunt .......................... | 332/124 |
| 4,140,981 A | | 2/1979 | Bergmann | |

FOREIGN PATENT DOCUMENTS

JP 1238205 9/1989

* cited by examiner

*Primary Examiner*—Arnold Kinkead
(74) *Attorney, Agent, or Firm*—Muncy, Geissler, Olds & Lowe, PLLC

(57) ABSTRACT

A circuit arrangement for frequency modulation is provided, which includes a voltage-controlled oscillator having at least one varactor diode that is driven by a drive signal, wherein a capacitance of the varactor diode depends on the drive signal, includes a modulating unit that creates a modulation signal for frequency modulation of the voltage-controlled oscillator, and includes a drive unit that generates the drive signal for the at least one varactor diode from the modulation signal, wherein the drive unit generates the drive signal from the modulation signal in such a manner that a linear relationship results between the modulation signal and the capacitance of the varactor diode.

7 Claims, 3 Drawing Sheets

CIRCUIT ARRANGEMENT FOR FREQUENCY MODULATION

This nonprovisional application claims priority to German Patent Application No. DE 102006061511, which was filed in Germany on Dec. 18, 2006, and to U.S. Provisional Application No. 60/875,810, which was filed on Dec. 20, 2006, and which are both herein incorporated by reference.

BACKGROUND OF THE INVENTION

1. Field of the Invention

The present invention relates to a circuit arrangement for frequency modulation.

2. Description of the Background Art

Circuit arrangements for frequency modulation usually include a voltage-controlled oscillator whose (resonant) frequency is modulated or changed as a function of a modulation signal. To this end, the voltage-controlled oscillator typically contains one or more so-called varactor or capacitance diodes, i.e., components whose capacitance changes as a function of a control voltage that is applied to them. As a result of the capacitance change, the resonant frequency of a resonant circuit that includes the varactor diode or diodes changes. Consequently, the voltage-controlled oscillator is an electrical oscillation source whose frequency can be modulated or changed by the application of a modulation signal. The varactor diode constitutes the frequency-determining element in this regard. Changing the voltage on the varactor diode changes its capacitance and thus the resonant frequency of the resonant circuit.

The capacitance vs. voltage characteristic curve of a varactor diode is not linear. Thus, when a modulation signal or a modulation voltage is used that deviates sinusoidally from a center value, for example, distortions arise as a result of the nonlinear capacitance vs. voltage characteristic curve. These distortions cause, for example, a frequency offset or a frequency shift of the frequency-modulated signal thus produced as compared to a case where a linear relationship exists between modulation voltage and capacitance. This frequency shift can cause errors in a receiver of the frequency-modulated signal, for example in evaluating the demodulated receive signal.

SUMMARY OF THE INVENTION

It is therefore an object of the present invention to provide a circuit arrangement for frequency modulation that permits frequency modulation through driving of a varactor diode, wherein the frequency-modulated signal produced can be evaluated and demodulated in as simple and error-free a manner as possible.

The inventive circuit arrangement for frequency modulation includes a voltage-controlled oscillator having at least one varactor diode that is driven by a drive signal, wherein a capacitance of the varactor diode depends on the drive signal, includes a modulating unit that creates a modulation signal for frequency setting or frequency modulation of the voltage-controlled oscillator, and includes a drive unit that generates the drive signal for the at least one varactor diode from the modulation signal. The drive unit generates the drive signal from the modulation signal in such a manner that, at least in an operating region, a linear relationship between the modulation signal and the capacitance of the varactor diode results. In other words, the capacitance of the at least one varactor diode is a linear function of the modulation signal in an operating region. The drive unit here functions as a driver that generates the drive signal or the drive voltage for the varactor diode from the modulation signal or the modulation voltage, wherein the capacitance vs. voltage characteristic curve of the varactor diode is taken into account in generating the drive signal in such a manner that a linear relationship between the modulation signal and the capacitance of the at least one varactor diode results. This prevents distortions or an unwanted frequency shift of the frequency-modulated signal, by which means errors in the evaluation of the demodulated signal are effectively prevented, for example.

In an aspect of the circuit arrangement, the drive unit includes a component whose current vs. voltage characteristic curve can be described by a second order polynomial. This component can be used for linearization of the nonlinear capacitance vs. voltage characteristic curve of the varactor diode.

In a further aspect of the circuit arrangement, the drive unit includes a field-effect transistor wired as a diode, preferably a MOS transistor wired as a diode, and especially preferably an NMOS transistor wired as a diode. The current vs. voltage characteristic curve of the field-effect or MOS transistor wired as a diode can be described by a second order polynomial.

In a further aspect of the circuit arrangement, a resistor is connected in parallel to the MOS transistor wired as a diode. The resistor can be used for characteristic curve matching.

In a further aspect of the circuit arrangement, the drive unit includes a field-effect transistor, in particular a MOS transistor to whose gate terminal the modulation signal is applied, wherein the drain-source path of the field-effect transistor is connected in series with the MOS transistor wired as a diode between a supply voltage and a reference voltage, in particular ground. The field-effect transistor can be configured as a so-called source follower, which passes on the drive voltage to the MOS transistor wired as a diode. The MOS transistor wired as a diode converts a linear voltage change into a quadratic current change, thus making possible a simple linearization of the capacitance vs. voltage characteristic curve which exhibits reciprocal behavior. Alternatively, the transistor can also be designed as a bipolar transistor, which is configured as a so-called emitter follower in order to pass the drive voltage on to the MOS transistor wired as a diode.

In a further aspect of the circuit arrangement, the arrangement includes a current-to-voltage converter, which produces a voltage from a current flowing through the drain-source path of the field-effect transistor, wherein the voltage constitutes the drive signal.

In a further aspect of the circuit arrangement, the drive unit includes a current mirror circuit, which mirrors a current flowing through the drain-source path of the field-effect transistor, and imposes it on a resistor, wherein the voltage establishing itself at the resistor constitutes the drive signal.

In a further aspect of the circuit arrangement, the arrangement includes a bias unit, which produces a bias current that is superimposed on the current produced by the current mirror circuit. The bias current can be used for setting the DC operating point of the varactor diode.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
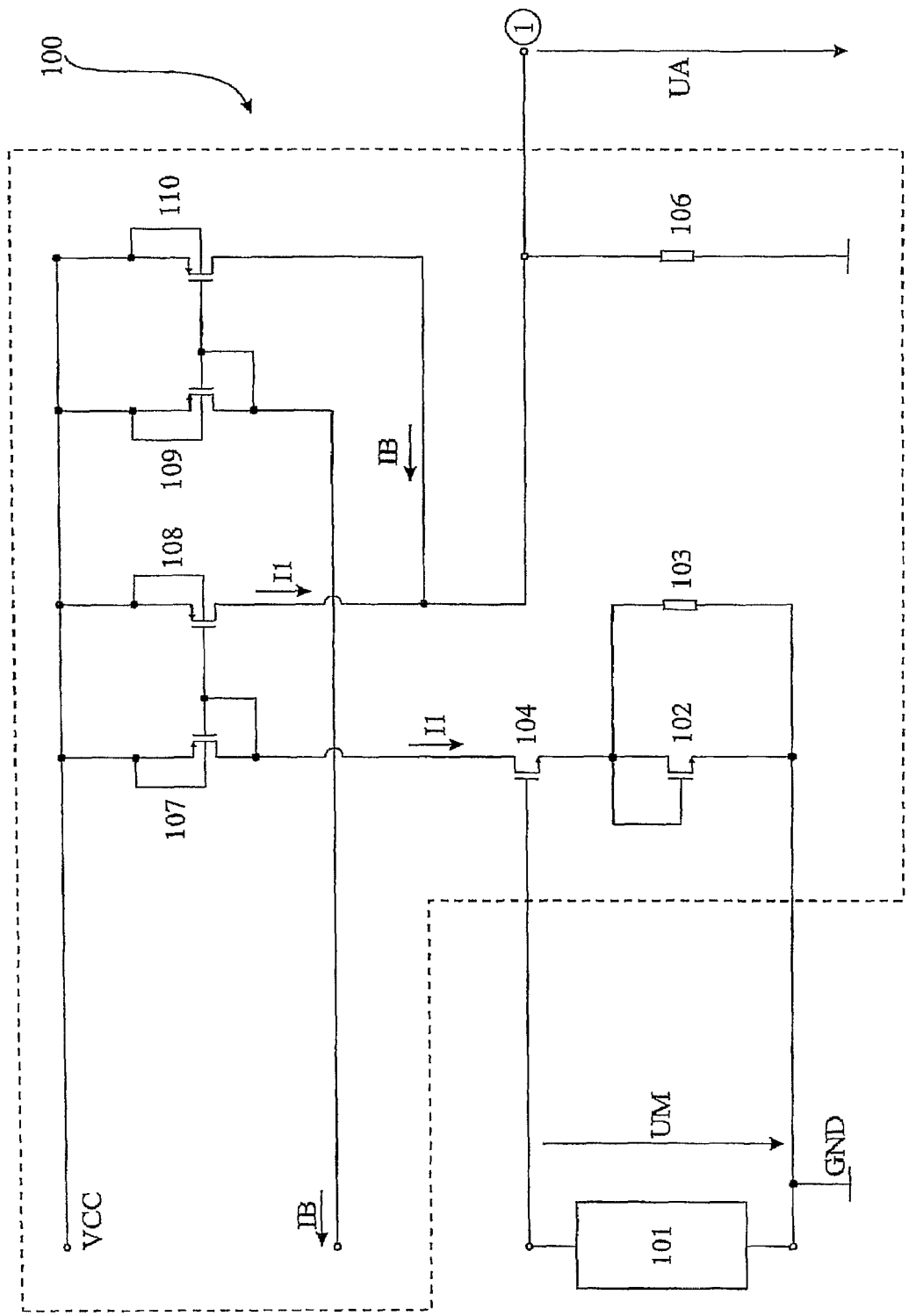
FIG. 1 illustrates a circuit diagram of a part of a circuit arrangement for frequency modulation with an inventive drive unit.

FIG. 1 shows a circuit diagram of a part of a circuit arrangement for frequency modulation with an inventive drive unit 100. The illustrated circuit arrangement also includes a modulating unit 101, which creates a modulation signal in the form of a modulation voltage UM for frequency setting or frequency modulation of a conventional voltage-controlled oscillator 200 shown in FIG. 2. A frequency-modulated output signal OUT of the voltage-controlled oscillator 200 is frequency modulated as a function of the modulation voltage UM.

Figure 2:
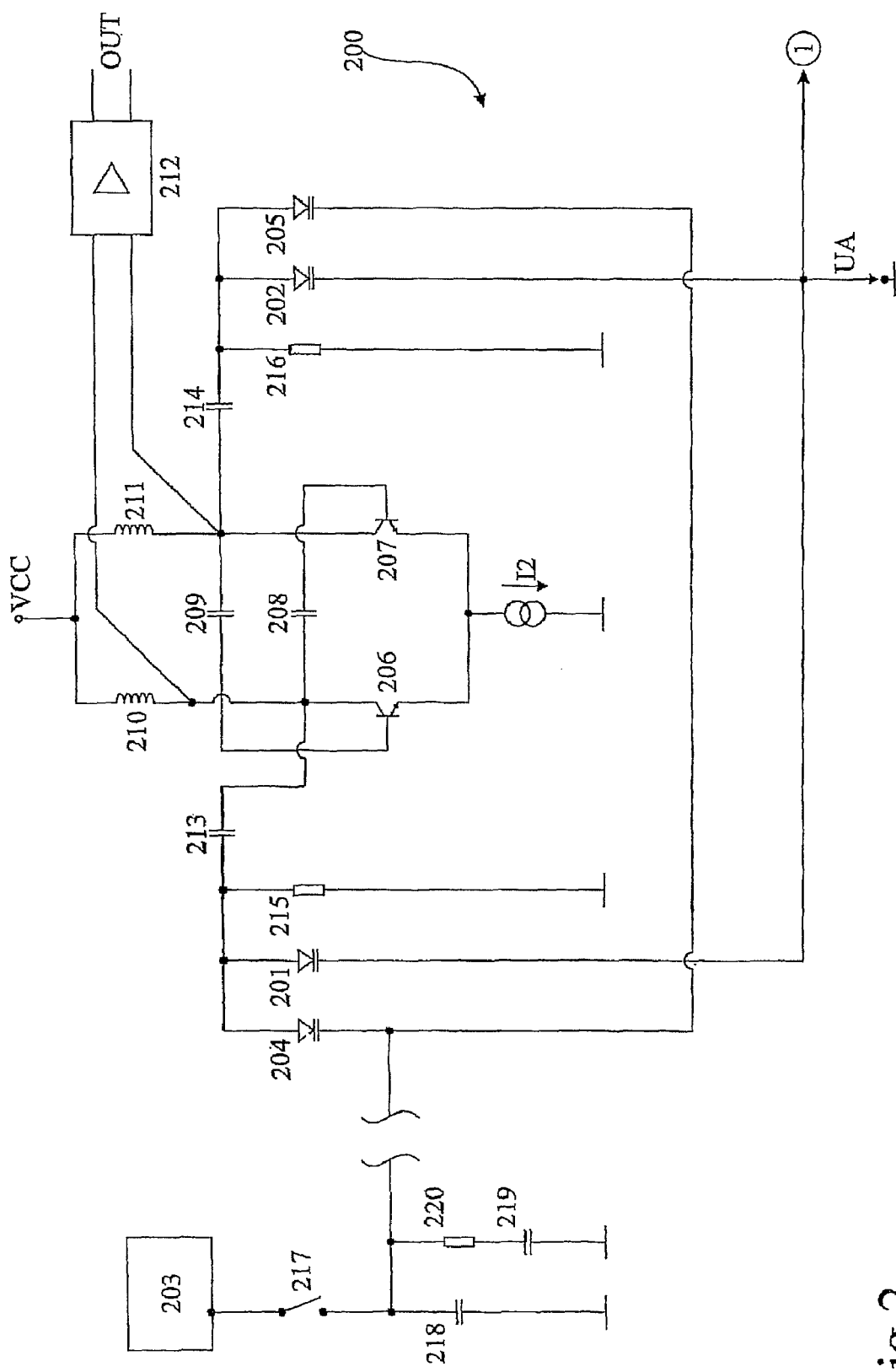
FIG. 2 illustrates a circuit diagram of a conventional voltage-controlled oscillator, which is driven by a drive signal generated by the drive unit from FIG. 1.

The drive unit 100 generates a drive signal in the form of a drive voltage UA from the modulation signal UM for varactor diodes 201 and 202 of the voltage-controlled oscillator 200 from FIG. 2. The respective cathodes of the varactor diodes 201 and 202 are connected to a terminal 1 of the drive unit 100, which is to say a voltage difference present at the varactor diodes 201 and 202 results from a difference between the drive voltage UA and a voltage at the respective anode of the varactor diodes 201 and 202.

The drive unit 100 generates the drive voltage UA from the modulation voltage UM in such a manner that a linear relationship results between the modulation voltage UM and the capacitance of the relevant varactor diodes 201 and 202. This prevents distortions or a frequency shift or frequency offset of the frequency-modulated output signal OUT of the voltage-controlled oscillator 200.

To this end, the drive unit 100 includes an NMOS transistor 102 wired as a diode, whose current vs. voltage characteristic curve can be described by a second order polynomial. A resistor 103 is connected in parallel to the NMOS transistor 102 wired as a diode.

The drive unit 100 additionally includes a field-effect transistor in the form of an NMOS transistor 104, to whose gate terminal the modulation voltage UM is applied, wherein the drain-source path of the NMOS transistor 104 is connected in series with the NMOS transistor 102 wired as a diode between a supply voltage VCC and a reference voltage GND.

The modulation voltage UM produced by the modulating unit 100 is output to the NMOS transistor 102 wired as a diode by the NMOS transistor 104 acting as a source follower. The current vs. voltage characteristic curve of the NMOS transistor 102 can essentially be described by a second order polynomial, which is to say that a current through the NMOS transistor 102 changes approximately quadratically as a function of the voltage output by the NMOS transistor 104 (a current flowing through the resistor 103 can be disregarded for these considerations). From this current, which essentially also flows through the drain-source path of the NMOS transistor 104, the drive voltage UA is produced by means of a current-to-voltage converter described below.

For the purpose of current-to-voltage conversion, the drive unit 100 includes a current mirror circuit, which mirrors the current I1 flowing through the drain-source path of the transistor 104, if necessary multiplied by a factor, and imposes it on a resistor 106, wherein the voltage establishing itself at the resistor 106 constitutes the drive voltage UA. To this end, the current mirror circuit includes, in a conventional manner, transistors 107 and 108, whose respective gate terminals are connected together.

A bias unit produces, from a current IB that is imposed externally, for example from an adjusting unit that is not shown, a mirrored bias current IB that is superimposed on the current I1 produced by the current mirror circuit. To this end, the bias unit includes a current mirror circuit in the form of transistors 109 and 110, which produces from the externally imposed current IB the mirrored bias current IB that is superimposed on the current I1. The bias current IB is used to set the DC operating point of the varactor diodes 201 and 202.

The resistor 103, which is connected in parallel to the transistor 102 wired as a diode, is used for matching the characteristic curve of the drive unit 100 to that of the voltage-controlled oscillator 200.

The voltage-controlled oscillator 200 shown in FIG. 2 is merely a schematic example of a conventional voltage-controlled oscillator. It is a matter of course that other voltage-controlled oscillators can also be used if they have one or more varactor diodes as frequency-determining components that are driven with the drive voltage UA produced by the drive unit 100 from the modulation signal UM.

In addition to the varactor diodes 201 and 202 that are used for frequency modulation, the voltage-controlled oscillator 200 also contains additional varactor diodes 204 and 205, to which a control voltage produced by a phase-locked loop (PLL) 203 is applied. The varactor diodes 204 and 205 are used to set an operating or carrier frequency of the voltage-controlled oscillator 200, wherein the carrier frequency is frequency-modulated by the modulation voltage UM or the drive voltage UA in conjunction with the varactor diodes 201 and 202.

The voltage-controlled oscillator 200 also contains a conventional attenuation compensation circuit containing a current source 12, transistors 206 and 207, and coupling capacitors 208 and 209, which are connected in a known manner to implement an attenuation compensation circuit. Coils 210 and 211 form a resonant circuit with the varactor diodes 201, 202, 204 and 205, wherein an oscillator signal produced by the resonant circuit is output by an amplifier 212 as the frequency-modulated output signal OUT. In addition, decoupling capacitors 213 and 214 and resistors 215 and 216 are provided in a known manner.

A switch 217 is provided at the output of the PLL 203 for setting the operating mode of the voltage-controlled oscillator 200. A capacitor 218 is connected between the switch 217 and ground. A resistor 220 and a capacitor 219 are connected in series between the switch 217 and ground. Additional components/assemblies can also be connected between the switch 217 and the cathodes of the varactor diodes 204 and 205 as needed.

The voltage-controlled oscillator 200 shown in FIG. 2 serves merely to schematically illustrate an oscillator with varactor diodes as frequency-determining components. It is a matter of course that additional components or wiring that differs in its details may be required for the functionality of the oscillator 200 shown. Other oscillators that are customary to one skilled in the art can be used in place of the oscillator 200 shown.

Figure 3:
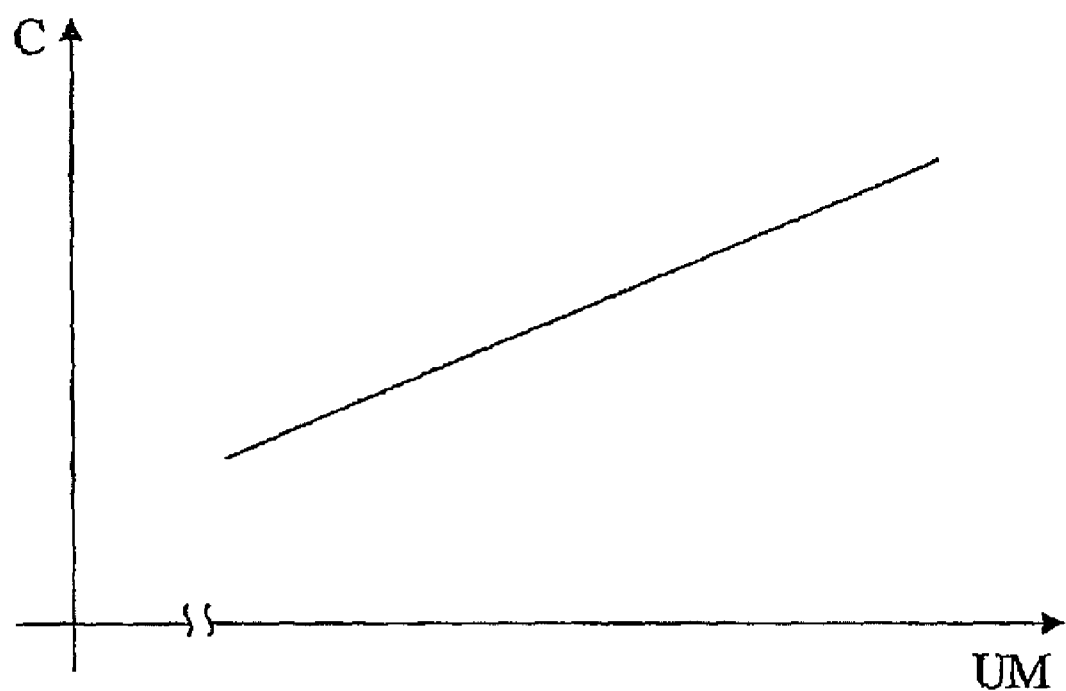
FIG. 3 is a graph that shows a capacitance of a varactor diode of the voltage-controlled oscillator shown in FIG. 2 as a function of a modulation signal.

FIG. 3 shows a graph displaying a capacitance C of the varactor diode 201 or 202 of the voltage-controlled oscillator 200 shown in FIG. 2 as a function of the modulation signal UM in an operating region of the inventive circuit arrangement. As is evident from FIG. 3, a linear relationship between the modulation signal UM and the capacitance C of the varactor diode 201 or 202 results in the operating region.

The embodiments shown cause a linear relationship to result between the modulation signal or the modulation voltage UM and the capacitance of the varactor diodes 201 and 202. Consequently, there is no frequency shift of the frequency-modulated output signal OUT such as occurs with the conventional, non-linear relationship between the modulation signal UM and the capacitance of the varactor diodes 201 and 202. The frequency-modulated signal produced can thus be demodulated or evaluated in a simple and error-free manner.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A circuit arrangement for frequency modulation comprising:
   a voltage-controlled oscillator having at least one varactor diode that is driven by a drive signal, a capacitance of the varactor diode being dependend on the drive signal;
   a modulating unit that creates a modulation signal for frequency modulation of the voltage-controlled oscillator; and
   a drive unit that generates the drive signal for the at least one varactor diode from the modulation signal;
   wherein the drive unit includes a component whose current versus voltage characteristic curve is a second order polynomial and generates the drive signal based on the modulation signal so that a linear relationship results between the modulation signal and the capacitance of the at least one varactor diode.

2. The circuit arrangement according to claim 1, wherein the drive unit includes a MOS transistor wired as a diode or an NMOS transistor wired as a diode.

3. A circuit arrangement for frequency modulation comprising:
   a voltage-controlled oscillator having at least one varactor diode that is driven by a drive signal, a capacitance of the varactor diode being dependend on the drive signal;
   a modulating unit that creates a modulation signal for frequency modulation of the voltage-controlled oscillator; and
   a drive unit that generates the drive signal for the at least one varactor diode from the modulation signal,
   wherein the drive unit generates the drive signal based on the modulation signal so that a linear relationship results between the modulation signal and the capacitance of the at least one varactor diode,
   wherein the drive unit includes a MOS transistor wired as a diode or an NMOS transistor wired as a diode, and
   wherein a resistor is connected in parallel to the MOS transistor wired as a diode.

4. The circuit arrangement according to claim 2, wherein the drive unit includes a field-effect transistor to whose gate terminal the modulation signal is applied, wherein the drain-source path of the field-effect transistor is connected in series with the MOS transistor wired as a diode between a supply voltage and a reference voltage.

5. The circuit arrangement according to claim 4, further comprising a current-to-voltage converter that produces a voltage from a current flowing through the drain-source path of the field-effect transistor, wherein the voltage constitutes the drive signal.

6. The circuit arrangement according to claim 4, further comprising a current mirror circuit, which mirrors a current flowing through the drain-source path of the field-effect transistor and imposes it on a resistor, wherein the voltage establishing itself at the resistor constitutes the drive signal.

7. The circuit arrangement according to claim 6, further comprising a bias unit, which produces a bias current that is superimposed on the current produced by the current mirror circuit.

* * * * *